United States Patent
Yin et al.

(10) Patent No.: US 12,490,487 B2
(45) Date of Patent: Dec. 2, 2025

(54) TUNABLE STRUCTURE PROFILE

(71) Applicant: Taiwan Semiconductor Manufacturing Company, Ltd., Hsinchu (TW)

(72) Inventors: Li-Wei Yin, Hsinchu (TW); Tzu-Wen Pan, Hsinchu (TW); Yu-Hsien Lin, Kaohsiung (TW); Jih-Sheng Yang, Hsinchu (TW); Shih-Chieh Chao, Taichung (TW); Chia Ming Liang, Taipei (TW); Yih-Ann Lin, Hsinchu (TW); Ryan Chia-Jen Chen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 392 days.

(21) Appl. No.: 18/155,933

(22) Filed: Jan. 18, 2023

(65) Prior Publication Data

US 2024/0120388 A1    Apr. 11, 2024

Related U.S. Application Data

(60) Provisional application No. 63/378,641, filed on Oct. 6, 2022.

(51) Int. Cl.
*H10D 64/01*   (2025.01)
*H01L 21/3213*   (2006.01)
*H10D 64/27*   (2025.01)

(52) U.S. Cl.
CPC ....... *H10D 64/01* (2025.01); *H01L 21/32139* (2013.01); *H10D 64/518* (2025.01)

(58) Field of Classification Search
CPC . H10D 64/01; H10D 64/518; H01L 21/32139
See application file for complete search history.

(56) References Cited

U.S. PATENT DOCUMENTS

| | | | | |
|---|---|---|---|---|
| 5,652,170 A | * | 7/1997 | Keller | H10B 12/033 |
| | | | | 257/E21.018 |
| 6,010,930 A | * | 1/2000 | Keller | H10B 12/033 |
| | | | | 257/E21.018 |

(Continued)

FOREIGN PATENT DOCUMENTS

| | | | | |
|---|---|---|---|---|
| CN | 1695237 A | * | 11/2005 | ........... H10D 64/117 |
| CN | 1742377 A | * | 3/2006 | ........... H10D 30/665 |

(Continued)

*Primary Examiner* — Laura M Menz
(74) *Attorney, Agent, or Firm* — Ingrassia Fisher & Lorenz, LLP

(57) ABSTRACT

Provided are structures and methods for forming structures with sloping surfaces of a desired profile. An exemplary method includes performing a first etch process to differentially etch a gate material to a recessed surface, wherein the recessed surface includes a first horn at a first edge, a second horn at a second edge, and a valley located between the first horn and the second horn; depositing an etch-retarding layer over the recessed surface, wherein the etch-retarding layer has a central region over the valley and has edge regions over the horns, and wherein the central region of the etch-retarding layer is thicker than the edge regions of the etch-retarding layer; and performing a second etch process to recess the horns to establish the gate material with a desired profile.

20 Claims, 9 Drawing Sheets

(56) References Cited

U.S. PATENT DOCUMENTS

| | | | | |
|---|---|---|---|---|
| 7,811,891 | B2 * | 10/2010 | Orlowski | H10D 30/0227 |
| | | | | 257/E21.198 |
| 8,497,554 | B2 * | 7/2013 | Wei | H10D 84/40 |
| | | | | 257/355 |
| 9,490,175 | B2 * | 11/2016 | Cheng | H10D 84/0142 |
| 9,583,485 | B2 * | 2/2017 | Chang | H01L 21/32136 |
| 9,978,647 | B2 * | 5/2018 | Hsiao | H10D 84/0151 |
| 10,373,876 | B2 * | 8/2019 | Hsiao | H10D 84/038 |
| 10,468,407 | B2 * | 11/2019 | Chang | H10D 84/0151 |
| 11,139,295 | B2 * | 10/2021 | Chang | H10D 62/115 |
| 11,626,495 | B2 * | 4/2023 | Tsai | H01L 23/485 |
| | | | | 257/288 |
| 12,027,594 | B2 * | 7/2024 | Hsiao | H10D 64/015 |
| 2004/0266115 | A1 * | 12/2004 | Chan | H10D 30/62 |
| | | | | 438/283 |
| 2006/0292843 | A1 * | 12/2006 | Kim | H01L 21/76897 |
| | | | | 257/E21.507 |
| 2007/0042552 | A1 * | 2/2007 | Ma | H10D 62/104 |
| | | | | 257/E29.136 |
| 2007/0197038 | A1 * | 8/2007 | Kim | H01L 21/32137 |
| | | | | 438/719 |
| 2011/0241117 | A1 * | 10/2011 | Wei | H10D 84/811 |
| | | | | 257/E21.409 |
| 2012/0001263 | A1 * | 1/2012 | Richter | H10D 30/601 |
| | | | | 257/E29.264 |
| 2015/0187927 | A1 * | 7/2015 | Wang | H10D 62/822 |
| | | | | 438/303 |
| 2016/0056082 | A1 * | 2/2016 | Cheng | H10D 84/038 |
| | | | | 438/8 |
| 2016/0343706 | A1 * | 11/2016 | Chang | H10D 64/667 |
| 2017/0179123 | A1 * | 6/2017 | Chang | H01L 21/76224 |
| 2017/0186652 | A1 * | 6/2017 | Hsiao | H10D 84/038 |
| 2018/0233416 | A1 * | 8/2018 | Hsiao | H10D 64/667 |
| 2019/0097013 | A1 * | 3/2019 | Chen | H01L 21/7684 |
| 2020/0066719 | A1 * | 2/2020 | Chang | H10D 64/666 |
| 2021/0183659 | A1 * | 6/2021 | Lin | H01L 21/31056 |
| 2021/0249429 | A1 * | 8/2021 | Liu | H10D 64/035 |
| 2023/0060763 | A1 * | 3/2023 | Hsiao | H10D 64/017 |
| 2023/0142968 | A1 * | 5/2023 | Tang | H10D 64/665 |
| | | | | 438/595 |
| 2023/0402455 | A1 * | 12/2023 | Tsai | H10D 30/751 |
| 2024/0120388 | A1 * | 4/2024 | Yin | H10D 64/518 |
| 2024/0297225 | A1 * | 9/2024 | Hsiao | H01L 21/31051 |
| 2024/0321739 | A1 * | 9/2024 | Yang | H01L 23/5283 |
| 2024/0379671 | A1 * | 11/2024 | Lin | H10D 30/62 |

FOREIGN PATENT DOCUMENTS

| | | | | |
|---|---|---|---|---|
| CN | 100479187 | C * | 4/2009 | H10D 30/665 |
| CN | 101582390 | A * | 11/2009 | H01L 21/76229 |
| CN | 101661902 | A * | 3/2010 | H10D 84/83 |
| CN | 103633011 | A * | 3/2014 | H01L 21/76229 |
| CN | 101582390 | B * | 5/2016 | H01L 21/76229 |
| CN | 103633011 | B * | 7/2017 | H01L 21/76229 |
| CN | 105448691 | B * | 6/2018 | H10D 84/0142 |
| CN | 113539963 | A * | 10/2021 | H10D 30/024 |
| CN | 114068704 | A * | 2/2022 | H10D 30/024 |
| CN | 114792657 | A * | 7/2022 | H10D 84/834 |
| CN | 115528097 | A * | 12/2022 | H10D 64/017 |
| CN | 116110789 | A * | 5/2023 | H10D 64/665 |
| CN | 220895510 | U * | 5/2024 | |
| CN | 118431162 | A * | 8/2024 | |
| CN | 222366547 | U * | 1/2025 | H10D 64/017 |
| JP | 2005353688 | A * | 12/2005 | |
| JP | 4290910 | B2 * | 7/2009 | H01L 21/76897 |
| KR | 100670666 | B1 * | 1/2007 | H01L 21/28 |
| KR | 20070000790 | A * | 1/2007 | H01L 21/76897 |
| KR | 20100013976 | A * | 2/2010 | H10D 84/0142 |
| KR | 20190054911 | A * | 5/2019 | H01L 23/562 |
| TW | I827501 | B * | 12/2023 | H10D 64/518 |
| TW | 202416382 | A * | 4/2024 | H10D 64/518 |
| TW | 202504044 | A * | 1/2025 | H10D 64/017 |
| TW | I888059 | B * | 6/2025 | |
| WO | WO-2007022370 | A2 * | 2/2007 | H10D 64/117 |
| WO | WO-2023179411 | A1 * | 9/2023 | H10D 30/60 |

* cited by examiner

TUNABLE STRUCTURE PROFILE

CROSS-REFERENCE TO RELATED APPLICATION

This application claims the benefit of U.S. Provisional Application No. 63/378,641, filed Oct. 6, 2022.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
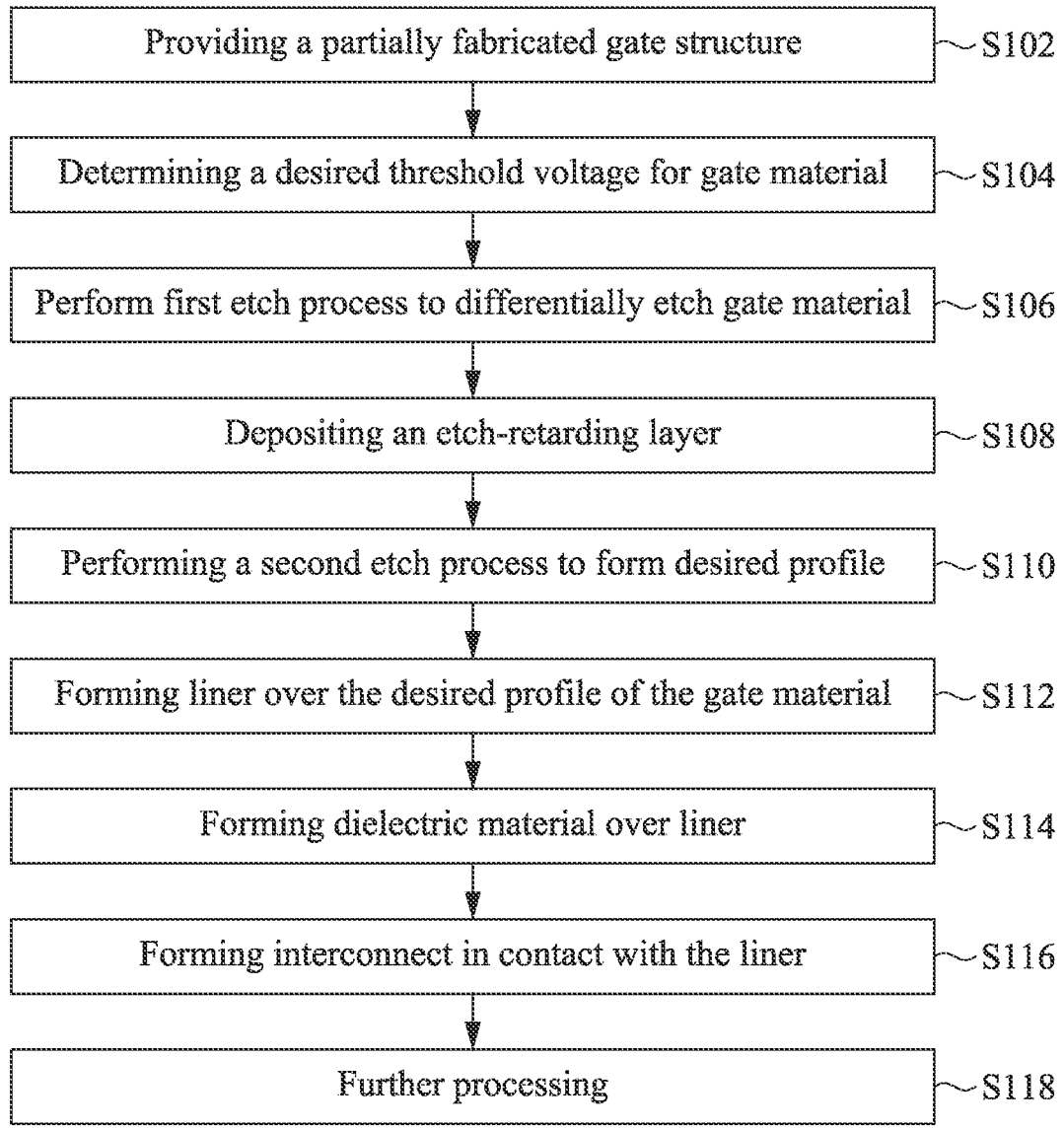
FIG. 1 is a flow chart illustrating a method, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over", "overlying", "above", "upper", "top", "under", "underlying", "beneath", "below", "lower", "bottom", "side", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments herein, a "material layer" is a layer that includes at least 50 wt. % of the identified material, for example at least 60 wt. % of the identified material, or at least 75 wt. % of the identified material, or at least 90 wt. % of the identified material; and a layer that is a "material" includes at least 50 wt. % of the identified material, for example at least 60 wt. % of the identified material, at least 75 wt. % of the identified material, or at least 90 wt. % of the identified material. For example, certain embodiments, each of a titanium nitride layer and a layer that is titanium nitride is a layer that is at least 50 wt. %, at least 60 wt. %, at least 75 wt. %, titanium nitride, or at least 90 wt. % titanium nitride.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

As described herein, an etching process is used to form a conductive gate with a desired profile. For example, in certain embodiments it may be desirable to increase the interfacial contact area between two layers, i.e., the area of surface contact. The interfacial contact area can be increased without increasing the footprint area defined by the lateral X dimension and longitudinal Y dimension by providing a first layer with a non-horizontally planar profile, i.e., a sloping profile with an increase and/or decrease in the vertical Z dimension, and then conformally depositing the second layer over the first layer.

Further, in certain embodiments, it may be desirable to increase the contact area between an interconnect and conductive layer. Again, the contact area can be increased without increasing the footprint area of the interconnect defined by the lateral X dimension and longitudinal Y dimension by providing a non-horizontally planar contact interface, i.e., a sloping contact interface with an increase and/or decrease in the vertical Z dimension.

Embodiments of the present disclosure offer advantages over the existing art, though it is understood that other embodiments may offer different advantages, not all advantages are necessarily discussed herein, and no particular advantage is required for all embodiments. For example, embodiments discussed herein include conductive gate structures and related methods for processing metal gate structures to provide conductive interconnections. In certain embodiments, a metal gate etch back in-situ etch-deposition-etch process is performed to provide a tunable line end horn profile to improve WAT.

In various embodiments, an initial etching process is performed to recess the metal gate structure to a recessed surface that is non-planar. More specifically, in certain embodiments, the recessed surface has a central valley from which the recess surface extends outward (in the Y-direction) and upward (in the Z-direction) to terminal horns. In order to tune the threshold voltage of the gate material, further etching process is performed in exemplary embodiments. For example, an etch-retarding layer is deposited over the recessed surface. In exemplary embodiments, the etch-retarding layer is formed with a greater thickness over the central valley and with a smaller thickness over the terminal horns. Thereafter, a second etch process is performed. The second etch process can be controlled to remove the thin portions of the etch-retarding layer and then selectively etch the terminal horns while the central valley region is still covered by the etch-retarding layer. As a result, the process can be controlled to trim the terminal horns to a desired profile. Thus, the process provides for threshold voltage tuning by line end horn thickness. Also, the effective gate length is increased due to the shape of the line end horn and provides more contact area between the metal gate and the overlying layer to reduce channel resistance (Rg). Further, as the horn profile increases the contact area with a later-formed conducive interconnect, the contact resistance (Rc) is reduced.

For purposes of the discussion that follows, FIG. 1 provides a flow chart of a method 100, in accordance with various embodiments. Method 100 is discussed below with reference to a gate such as a metal gate formed in a replacement gate process. However, it will be understood that aspects of method 100 may be equally applied to other types of structures without departing from the scope of the present disclosure. It is understood that method 100 includes steps having features of a complementary metal-oxide-semiconductor (CMOS) technology process flow and thus, are only described briefly herein. Also, additional steps may be performed before, after, and/or during method 100.

Method 100 is described below with initial reference to FIG. 2, which illustrates a plan layout view of the semiconductor device 200, and to FIGS. 3-8 which illustrate the semiconductor device 200 at various stages of fabrication according to method 100. FIGS. 3-8 provide cross-sectional views of an embodiment of the semiconductor device 200 along a "Y-cut" or a plane substantially parallel to a Y-axis of FIG. 2.

Figure 2:
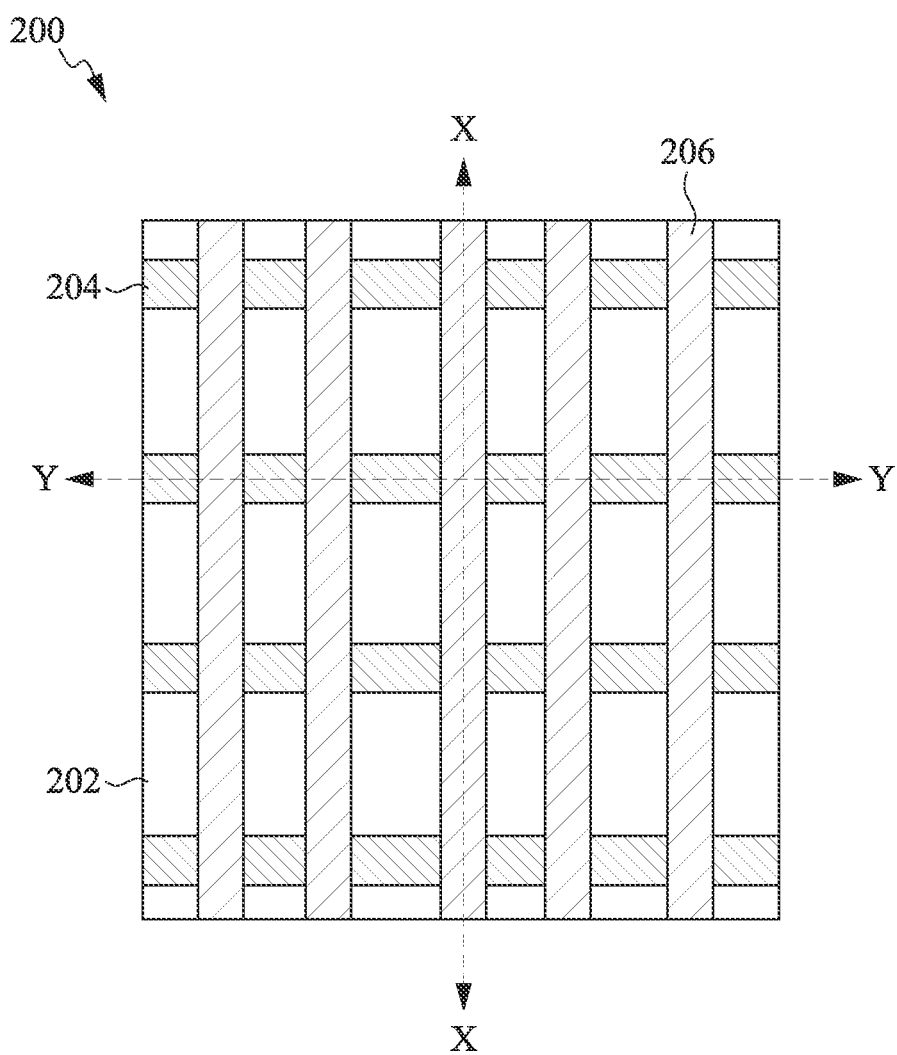
FIG. 2 is a plan layout view of a semiconductor device, in accordance with some embodiments.
Figure 3:
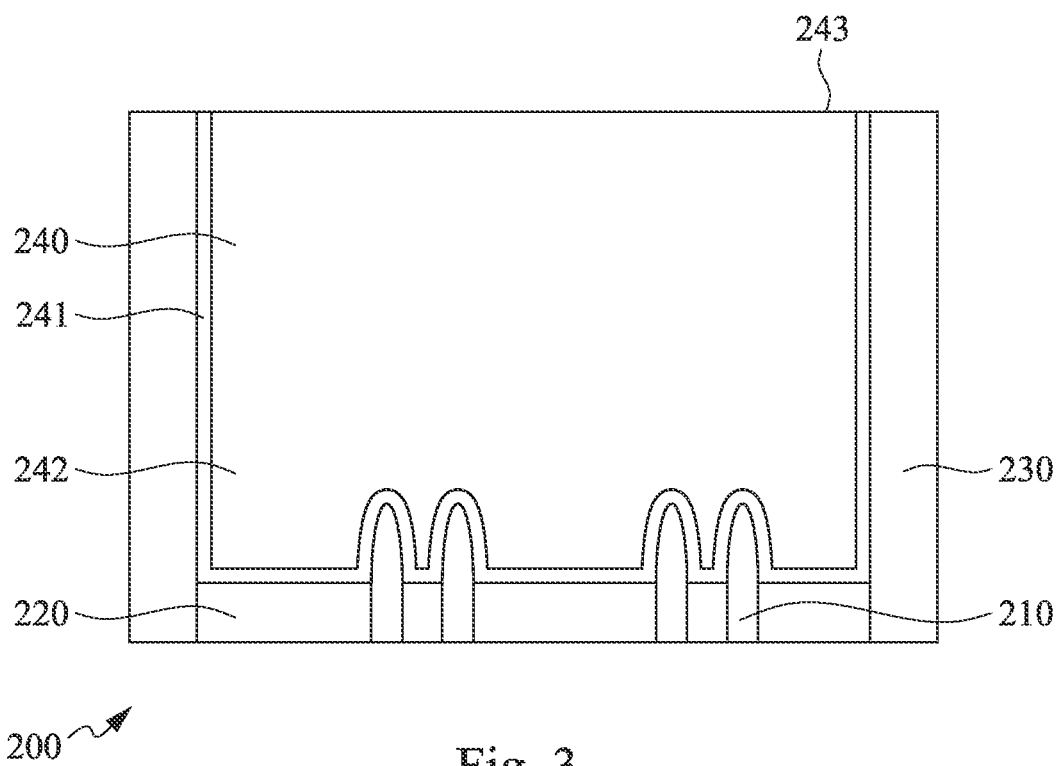
FIGS. 3-8 are cross-sectional views of a structure of the semiconductor device during successive stages of fabrication, in accordance with some embodiments.

As shown in FIG. 2, the semiconductor device 200 includes a substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epi layer, may be strained for performance enhancement, may include a silicon-on-insulator (SOI) structure, and/or have other suitable enhancement features.

In exemplary embodiments, source/drain regions or active regions 204 are formed in or over the substrate 202. Exemplary active regions 204 are parallel and, in the orientation of the Figures, extend in the Y-direction. In various examples, the source/drain features 204 include semiconductor epi layers such as Ge, Si, GaAs, AlGaAs, SiGe, GaAsP, SiP, or other suitable material, which may be formed by one or more epitaxial processes. In some embodiments, the source/drain features 204 may be in-situ doped during the epi process. For example, in some embodiments, epitaxially grown SiGe source/drain features may be doped with boron. In some cases, epitaxially grown Si source/drain features may be doped with carbon to form Si:C source/drain features, phosphorous to form Si:P source/drain features, or both carbon and phosphorous to form SiCP source/drain features. In some embodiments, the source/drain features 204 are not in-situ doped, and instead an implantation process is performed to dope the source/drain features 204. In some embodiments, formation of the source/drain features 204 may be performed in separate processing sequences for each of N-type and P-type source/drain features.

As shown in FIG. 2, the device 200 further includes gate structures 206. In exemplary embodiments, the gate structures 206 are parallel and, in the orientation of the Figures, extend in the X-direction.

It is contemplated that the gate structures may be part of a fin field-effect transistor (FinFET) a gate-all-around (GAA) transistor, or other type of multi-gate device. Further, the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow.

It is understood that method 100 includes steps having features of a complementary metal-oxide-semiconductor (CMOS) technology process flow and thus, are only described briefly herein. Also, additional steps may be performed before, after, and/or during method 100.

Method 100 begins at block S102 where a partially fabricated gate structure is provided. Referring to the example of FIG. 3, in an embodiment of block S102, the partially fabricated device 200 includes active regions 210. Active regions 210 may be the upper ends of three-dimensional fins of semiconductor material formed from substrate 202 of FIG. 1.

Shallow trench isolation (STI) features 220 may also be formed interposing the active regions 210. In some embodiments, the STI features 220 include SiO2, silicon nitride, silicon oxynitride, fluorine-doped silicate glass (FSG), a low-k dielectric, combinations thereof, and/or other suitable materials known in the art. In various examples, the dielectric layer used to form the STI features may be deposited by a CVD process, a subatmospheric CVD (SACVD) process, a flowable CVD process, an ALD process, a PVD process, and/or other suitable process.

A gate structure 240 is formed over the active regions 210. In the illustrated embodiment, the gate structure 240 includes a layer 241 and a conductive metal 242 in a high-K/metal gate stack or plug.

An exemplary layer 241 is a high-K gate dielectric. High-K gate dielectrics, as used and described herein, include dielectric materials having a high dielectric constant, for example, greater than that of thermal silicon oxide (about 3.9). An exemplary high-K gate dielectric layer 241 may include a high-K dielectric material such as hafnium oxide (HfO2). Alternatively, the high-K gate dielectric layer 241 may include other high-K dielectric materials, such as TiO2, HfZrO, Ta2O3, HfSiO4, ZrO2, ZrSiO2, LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), combinations thereof, or other suitable material. The high-K gate dielectric layer 241 may be formed by ALD, physical vapor deposition (PVD), CVD, oxidation, and/or other suitable methods.

The gate structure 240 may further include a metal gate material 242 formed over the gate dielectric layer 241. The metal layer 242 may include a metal, metal alloy, or metal silicide. The metal layer 242 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 242 may include Al, Ti, Ag, TiAlN, TaC, TaCN, TaSiN, Mn, Zr, TiN, TaN, Ru, Mo, W, WN, Cu, Re, Ir, Co, Ni, other suitable metal materials or a combination thereof. In various embodiments, the metal layer 242 may be formed by ALD, PVD, CVD, e-beam evaporation, or other suitable process. Further, the metal layer 242 may be formed separately for N-type and P-type transistors which may use different metal layers. In addition, the metal layer 242 may provide an N-type or P-type work function, may serve as a transistor gate electrode, and in at least some embodiments, the metal layer 242 may include a polysilicon layer.

As further shown, a spacer layer 230 may be formed on the sidewalls of the gate structure 240. The spacer layer 230 may be formed prior to formation of the high-K/metal gate stack of the gate structure. For example, in some cases, the spacer layer 230 may be formed on sidewalls of a previously formed dummy (sacrificial) gate stack that is removed and replaced by the high-K/metal gate stack as part of a replacement gate (gate-last) process. In some cases, the spacer layer 230 may have a thickness of from 2 to 10 nanometers (nm). In some examples, the spacer layer 230 may include a dielectric material such as silicon oxide, silicon nitride, silicon carbide, silicon oxynitride, SiCN, silicon oxycarbide, SiOCN, SiOHCN, a low-K material (e.g., with a dielectric constant 'k'<7), and/or combinations thereof. In some embodiments, the spacer layer 230 includes multiple layers, such as main spacer layers, liner layers, and the like.

Thus, block S102 may include performing a replacement gate process including removing a sacrificial gate structure to form a cavity, depositing gate material in the cavity; and planarizing the metal gate material to define a planar upper surface 243 of the gate 240.

Method 100 further includes, at block S104, determining a desired threshold voltage for gate material. Such determination may be made based on the intended use of the gate, the dimensions and materials of the gate structure, and the dimensions and material of the layers to be formed over the gate and/or interconnected to the gate. Based on the determination of the desired threshold voltage, a desired profile of the gate material is selected.

Method 100 may continue at block S106, with performing a first etch process to differentially etch the gate material. As shown, in FIG. 4, the etch process recesses the gate 240 to a recessed surface 250. As shown the recessed surface 250 includes a central valley 251 and extends outward and upward to a first terminal horn 252 at a first edge 262 of the gate 240 and to a second terminal horn 253 at a second edge 263 of the gate 240.

In exemplary embodiments, the etch is a dry etch and may be performed with a BCl3/Cl2/O2 gas, at a pressure of from 1 to 200 mTorr, at a power of from 400 to 1200 W, and with a bias of from 0 to 100 W. While this etch processes is described, other suitable etching processes may be used.

Method 100 may continue at block S108, with depositing an etch-retarding layer 500 over the recessed surface 250. As shown, the etch-retarding layer 500 is formed with a central region 501 over the central valley 251 and with edge regions 502 and 503 over the horns 252 and 253. An exemplary etch-retarding layer has a non-uniform thickness including a minimum thickness at a thin region and a maximum thickness at a thick region. For example, as shown, the central region 501 of the etch-retarding layer is thicker than the edge regions of the etch-retarding layer, such that the central region 501 is a thick region 501 and the edge regions 502 and 503 are thin regions 502 and 503. For example the thickness of the central region 501 may be at least 1.1, at least 1.2, at least 1.3, at least 1.4, at least 1.5, at least 1.6, at least 1.7, at least 1.8, at least 1.9, at least 2.0, at least 2.1, at least 2.2, at least 2.3, at least 2.4, or at least 2.5, times greater than the thickness of the edge regions 502 and 503 as measured at the interface of the dielectric 241 and the gate material 242.

In exemplary embodiments, the etch-retarding layer is a polymer. An exemplary polymer may be formed with a process performed with BCl3/CH4/HBr gas or SiCl4/O2/HBr gas, at a pressure of from 10 to 200 mTorr, at a power of from 400 to 1200 W, and with a bias of from 0 to 20 W.

At action block S110, method 100 includes performing a second etch process to recess the horns 252 and 253 to establish the gate 240 with an upper surface 600 of the desired profile.

In certain embodiments, the second etch is a dry etch. In certain embodiments, the second etch is a dry etch performed with CF4/O2/N2, NF3/O2/N2, or BCl3/Cl2/O2 gas, at a pressure of from 1 to 200 mTorr, at a power of from 400 to 1200 W, and with a bias of from 0 to 20 W. While these etch processes are described, other suitable etching processes may be used.

Figure 6:
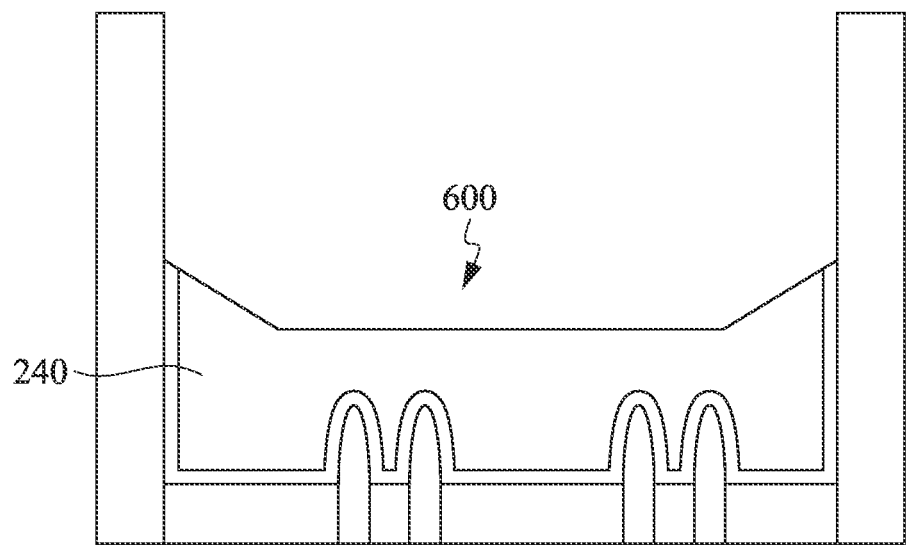
Figure 7:
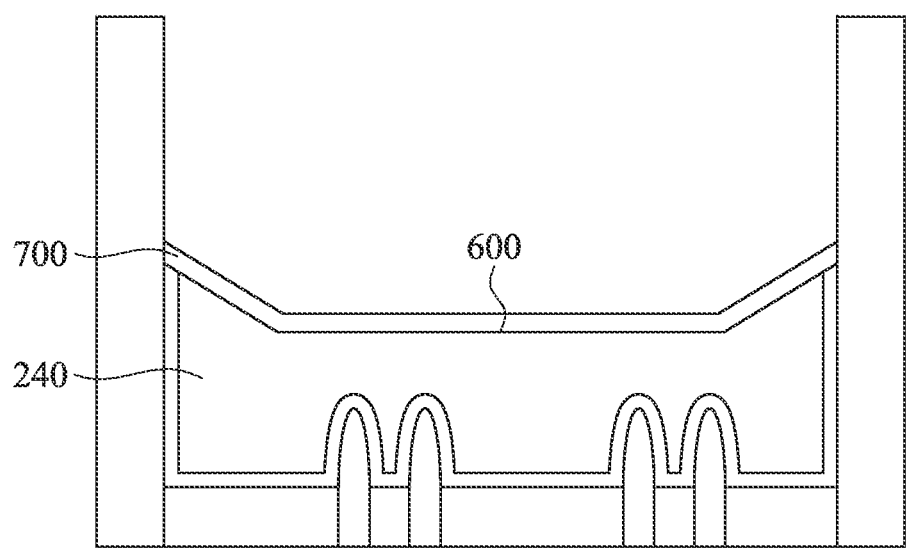

In order to achieve the desired profile of the gate, the duration of the second etch is controlled. In FIG. 6, the second etch is performed for a relatively short duration, resulting in generally larger horns. With larger horns, there is less gate metal loss, and a lower threshold voltage for a NMOS device, but a higher threshold voltage for a PMOS device.

After establishing the desired profile of the upper surface 600, method 100 may continue with forming a liner 700 over the upper surface 600 of the gate structure 240 at action block S112. An exemplary liner 700 is conductive, such as a metal. In exemplary embodiments, the liner 700 is tungsten. The liner 700 may be formed using ionized physical vapor deposition (ionized PVD), although other suitable deposition processes and thicknesses may be used. As shown the exemplary liner 700 is conformal and is formed with a generally constant thickness. In exemplary embodiments, the gate structure 240 may be considered to include the gate dielectric 241, the gate metal 242, and the liner 700.

Figure 8:
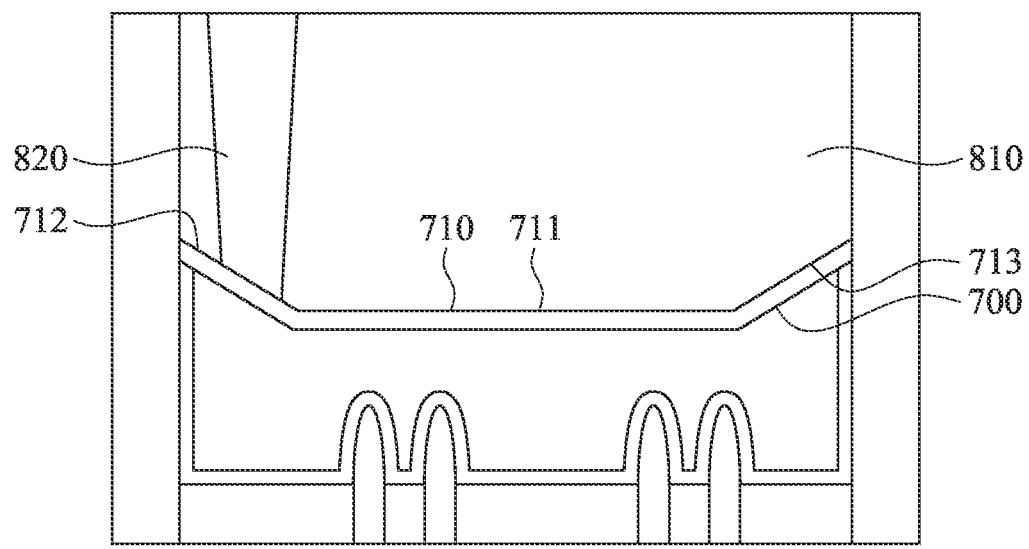

Method 100 continues at block S114 with forming dielectric material 810 over the liner 700, as shown in FIG. 8. An exemplary dielectric material 810 is SiN, though any suitable dielectric may be used. The dielectric material 810 may be deposited by a re-fill process.

Method 100 further includes, at block S116, forming an interconnect 820 in electrical contact with the liner 700, as shown in FIG. 8. An exemplary interconnect 820 is a conductive material such as a metal, for example cobalt, aluminum, copper, or other suitable material.

Method 100 may continue at block S118 with further processing of the device 200. Generally, the further processing may form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including cobalt, aluminum, copper, tungsten, and/or silicide. Moreover, additional process steps may be implemented before, during, and after method 100, and some process steps described above may be replaced or eliminated in accordance with various embodiments of method 100.

Figure 9:
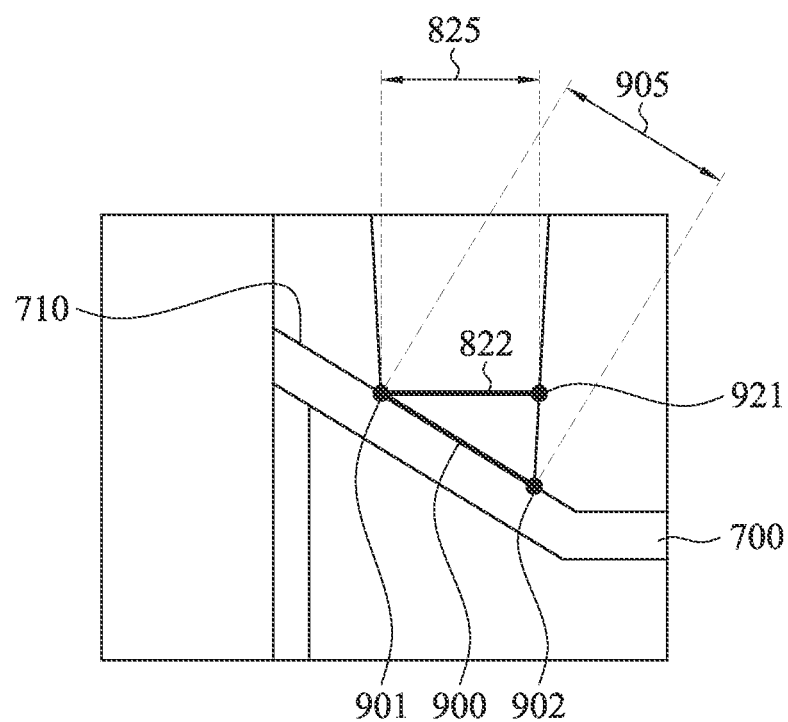
FIG. 9 is a focused cross-sectional view of an interface between an interconnect and a sloped surface of the structure of FIG. 8, in accordance with some embodiments.

Cross-referencing FIG. 8 with FIG. 9, a focused view of the interface 900 between the interconnect 820 and the liner 700 is provided. As shown, the liner 700 has a sloped top surface 710. More specifically, the top surface 710 includes a first sloped region 712, a second sloped region 713, and a flat region 711 therebetween.

In exemplary embodiments, the interconnect 820 is formed in contact with the sloped region 712 of the top surface 710 of the liner 700. As a result, the contact interface 900 between the interconnect 820 and the liner 700 (and of the gate structure 240) extends from an upper end 901 to a lower end 902. Thus, the contact interface 900 has an interface length 905 that is greater than or equal to the distance between the upper end 901 and the lower end 902. Further, the contact interface 900 has an interface area that is a product of the interface length.

Further, the interconnect 820 has a horizontal cross-section 822 defined at the upper end 901 of the contact interface 900. The horizontal cross-section 822 extends a cross-sectional distance 825 from the upper end 901 to a location 821 at the same height and on the opposite edge of the interconnect 820, and has an interconnect cross-sectional area which is a product of the cross-sectional distance 825.

In exemplary embodiments, the interface length 905 is greater than the cross-sectional distance 825, and the contact interface area is greater than the interconnect cross-sectional area. In such embodiments, the contact interface area is about 1.05 to about 1.4 times greater than the interconnect cross-sectional area. As a result of the enlarged contact interface area, contact resistance (Rc) may be reduced. Further, the reduction in contact resistance (Rc) may be obtained even with a reduction in cross-sectional distance 825 as device size is reduced.

Figure 13:
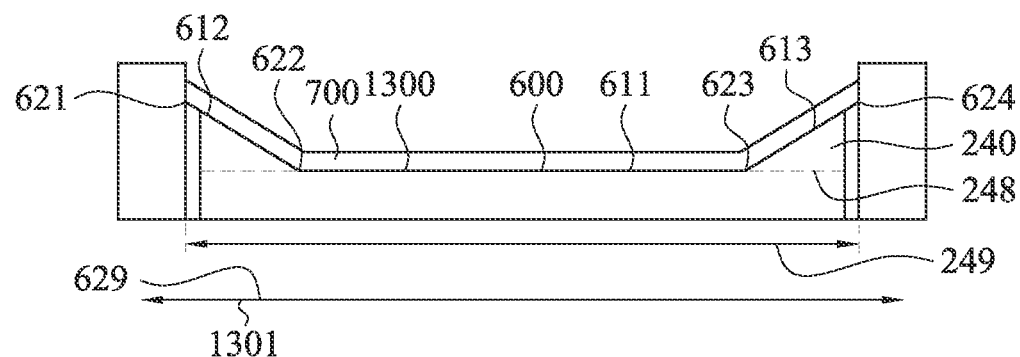
FIG. 13 is a focused cross-sectional view of an interface between the gate material and the liner of FIG. 7, in accordance with some embodiments.

Cross-referencing FIG. 8 with FIG. 13, a focused view of the interface 1300 between the liner 700 and the upper surface 600 of the gate 240 (including the gate material 242 and layer 241) is provided. As shown, the upper surface 600 is sloped. Specifically, the upper surface 600 includes a first sloped region 612, a second sloped region 613, and a flat region 611 therebetween. The upper surface 600 extends from a highest point 621 at the left edge to a lowest point 622, to a lowest point 623 across the central region, to a highest point 624 at the right edge, such that a surface length 629 from point 621 to point 624 is defined. In exemplary embodiments, the liner 700 covers the entire upper surface 600 of the gate 240. Thus, the interface 1300 has an interface length 1301 equal to the surface length 629 and has an interface area that is a product of the length 1301.

The gate 240 includes a horizontal cross section 248 at the lowest point 622 and 623 of the sloped upper surface 600. The horizontal cross section 248 has a length 249. A cross-sectional area of the gate is defined as a product of the length 249.

In exemplary embodiments, gate interface length 1301 is greater than cross-section length 249, and the gate interface area is greater than the cross-sectional area. In exemplary embodiments, the gate interface area is about 1.05 to about 1.4 times greater than the cross-sectional area.

Figure 15:
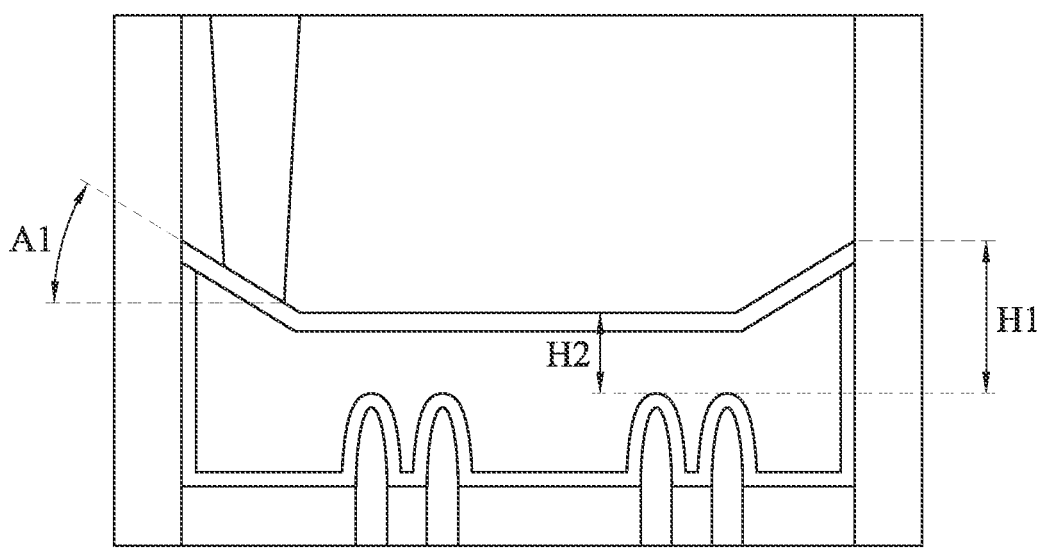
FIG. 15 is a cross-sectional view of the structure of FIG. 8 with additional geometrical measurements noted, in accordance with some embodiments.

Cross-referencing FIGS. 8, 9 and 15, further features are described. In FIG. 13, an angle Al of the slope of the first horn, of the liner overlying the first horn, and of the interconnect interface is shown. In exemplary embodiments, the angle Al is from 5 to 45 degrees. While not labeled, in exemplary embodiments, the corresponding angle of the second horn may be from 5 to 20 degrees. In exemplary embodiments, the difference in the angles of the horn on the left and right sides is from 0 to 20 degrees.

In FIG. 15, the height of the top of the horn portion of metal gate over the top of the active areas is shown as H1. In exemplary embodiments, H1 is from 10 to 30 nm. As further shown, the height of the central valley over the top of the active areas is H2. In exemplary embodiments, H2 is from 2 to 25 nm. It is noted that the central valley, though illustrated as being relatively planar, may include waves. For example, the height of the central valley over the top of the active areas may vary by 0.5 to 5 nm across the upper surface of the gate. Further, the difference in height between the horns H1 and the central valley height H2 may be from 3 to 15 nm.

It is further noted that dimensions and ratios of dimension may differ depending on the cross-sectional width of the gate. For a small gate, having a critical dimension or width in the Y-direction of about 50 nm, the angle Al may be increased as compared to a large gate, having a critical dimension or width in the Y-direction of about 600 nm. For example, angle Al may be higher in a small gate by about 0 to 30 degrees, as compared to the angle Al in a large gate.

Figure 14:
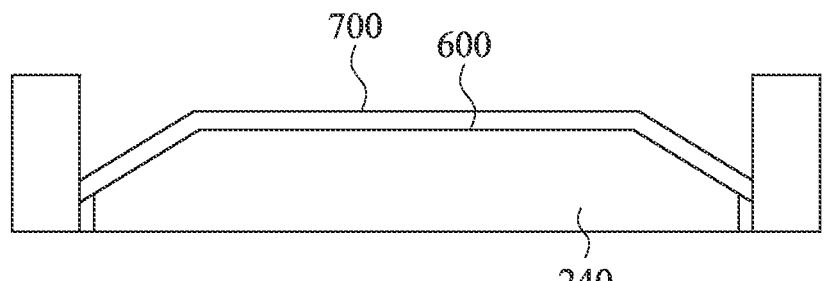
FIG. 14 is a focused cross-sectional view of an interface between a gate material and a liner, in accordance with some embodiments.

While the method 100 described herein deals with a sloping surface having a lowest point at a central location and highest points at terminal edges, the opposite geometry is also contemplated. For example, FIG. 14 illustrates a gate 240 with an upper surface 600 having such a geometry. As shown, liner 700 is formed over the upper surface 600. Similar to FIG. 14, the interfacial area between the upper surface 600 and the liner 700 is greater than a cross-sectional area of either the liner 700 or the gate 240 adjacent to the interface.

Figure 10:
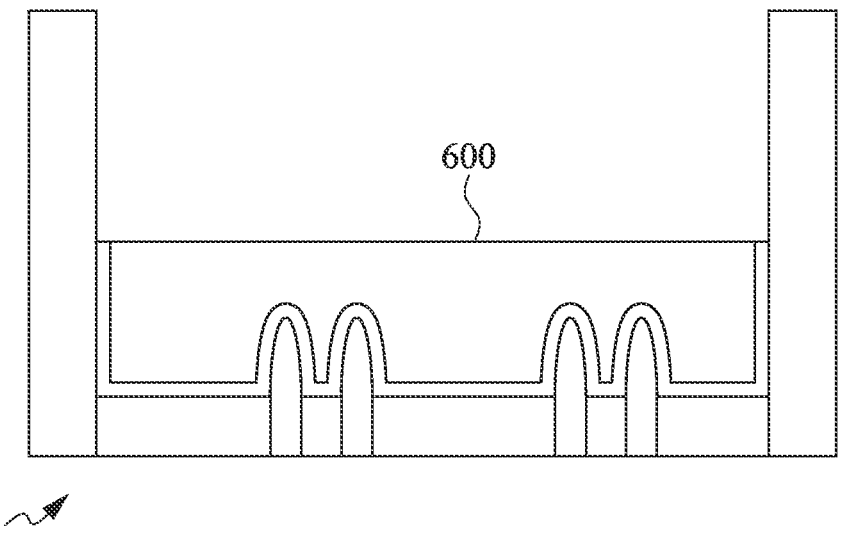
FIGS. 10-12 are cross-sectional views illustrating alternative processing of the structure of FIG. 5, in accordance with some embodiments.
Figure 11:
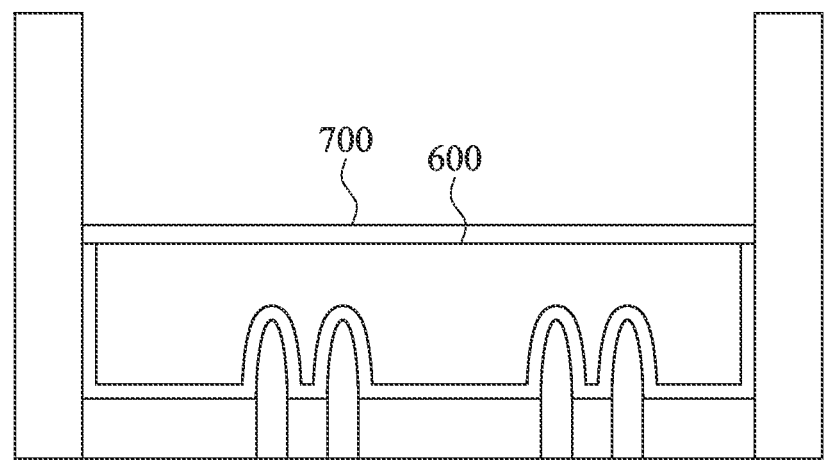
Figure 12:
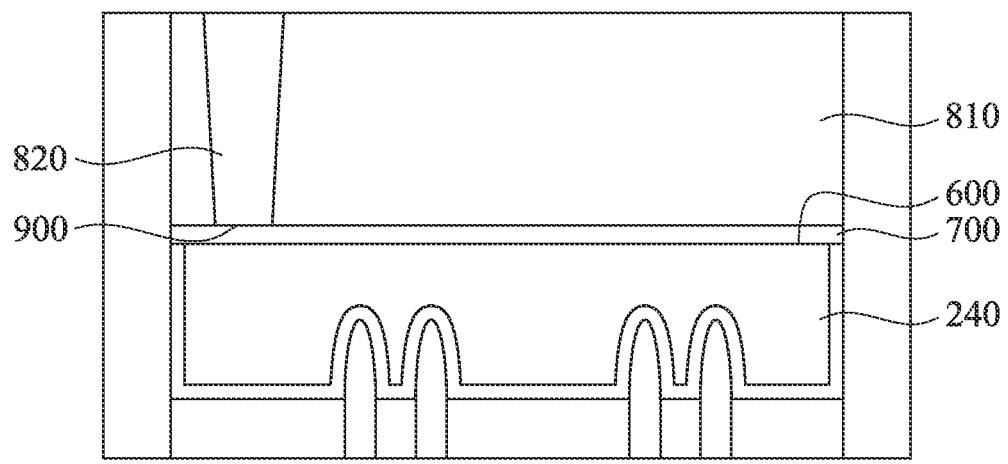

Referring to FIGS. 10-12, an alternative embodiment of the second etching process is illustrated. Specifically, from FIG. 5, the second etching process is performed for a relative long duration, resulting in the elimination of the horns, as shown in FIG. 10. Specifically, the upper surface 600 is formed as a substantially planar surface, i.e., non-sloping. With the elimination of the horns, there is more gate metal loss, and a lower threshold voltage for a PMOS device, but a higher threshold voltage for an NMOS device.

Figure 4:
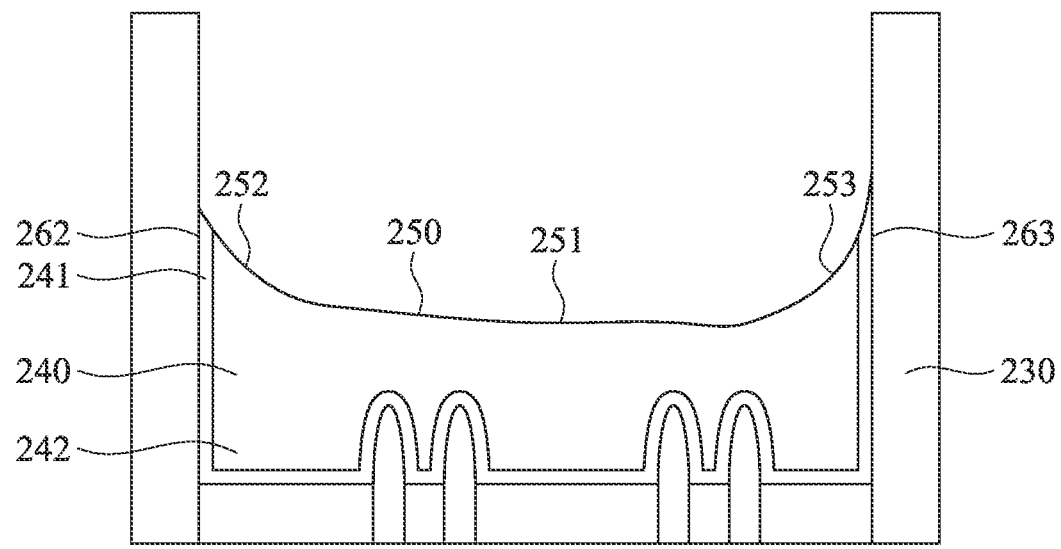
Figure 5:
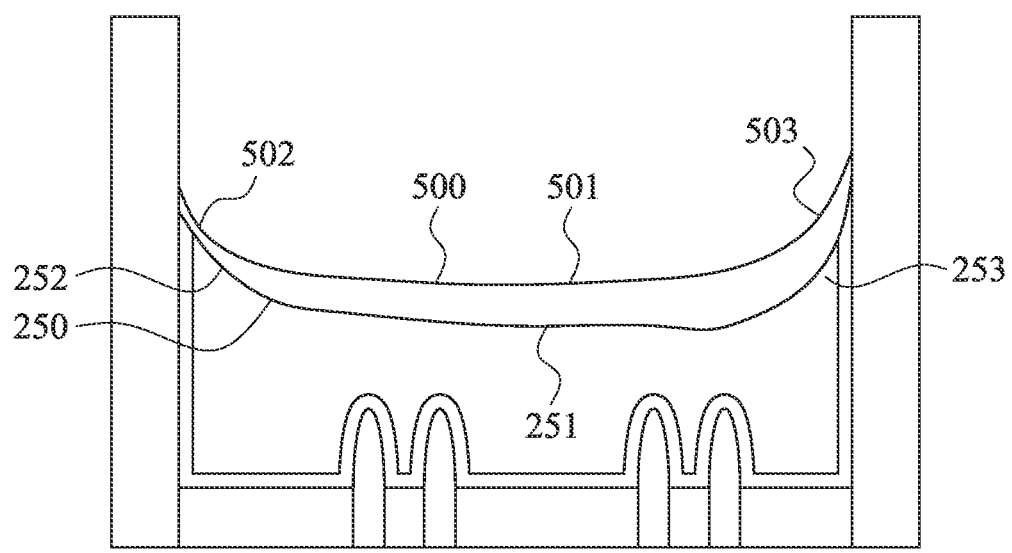

As may be understood from comparing FIGS. 4 and 10, the second etching process may be controlled to provide any desired recessed surface profile, depending on the duration of the etch and the etch-retarding layer and dimensions.

In FIG. 11, the liner 700 is formed over the non-sloping upper surface 600. In FIG. 12, dielectric material 810 is formed over the liner 700, and an interconnect 820 is formed in electrical contact with the liner 700. An exemplary interconnect 820 is a conductive material such as a metal, for example cobalt, aluminum, copper, or other suitable material.

As the upper surface of FIGS. 10-12 is planar and non-sloping, the interface area between the gate 240 and the liner 700 and the cross-sectional area of the gate 240 are substantially equal. Likewise, the contact interface 900 between the interconnect 820 and the liner 700 has an area that is substantially equal to the cross-sectional area of the interconnect 820 adjacent the interface 900.

In exemplary embodiments, a method is provided and includes performing a first etch process to differentially etch a gate material to a recessed surface, wherein the recessed surface includes a first horn at a first edge, a second horn at a second edge, and a valley located between the first horn and the second horn; depositing an etch-retarding layer over the recessed surface, wherein the etch-retarding layer has a central region over the valley and has edge regions over the horns, and wherein the central region of the etch-retarding layer is thicker than the edge regions of the etch-retarding layer; and performing a second etch process to recess the horns to establish the gate material with a desired profile.

In exemplary embodiments, the method further includes forming a liner over the desired profile of the gate material, wherein the gate material and the liner form a gate; forming a dielectric material over the gate; and forming an interconnect in contact with the gate.

In exemplary embodiments, the method includes, before performing the first etch process, depositing the gate material in a cavity over an active area; and planarizing the metal gate material to define a planar upper surface of the gate.

In exemplary embodiments of the method, the etch-retarding layer is a polymer.

In exemplary embodiments, the method includes determining a desired threshold voltage for the gate material, wherein the desired profile of the gate material is selected based on the desired threshold voltage.

In exemplary embodiments, the method includes forming a liner over the desired profile of the gate material, wherein the gate material and the liner form a gate; wherein the desired profile of the gate material comprises a sloped upper surface having a lowest point; wherein the liner contacts the sloped upper surface along a gate interface having a gate interface area; wherein a horizontal cross section of the gate material at the lowest point of the sloped upper surface has a cross-sectional area; and wherein the gate interface area is greater than the cross-sectional area. In such embodiments, the gate interface area is about 1.05 to about 1.4 times greater than the cross-sectional area.

In exemplary embodiments, the method includes forming a liner over the desired profile of the gate material, wherein the liner has a sloped top surface; and forming an interconnect in contact with the sloped top surface of the liner at a contact interface extending from an upper end to a lower end and defining a contact interface area; wherein a horizontal cross-section of the interconnect at the upper end of the contact interface has an interconnect cross-sectional area, and wherein the contact interface area is greater than the interconnect cross-sectional area. In such embodiments, the contact interface area is about 1.05 to about 1.4 times greater than the interconnect cross-sectional area.

In other embodiments, a method is provided and includes depositing an etch-retarding layer over an upper surface of a metal gate material, wherein the etch-retarding layer completely covers the upper surface of the metal gate material, and wherein the etch-retarding layer has a non-uniform thickness including a minimum thickness at a thin region and a maximum thickness at a thick region; and performing an etch process to remove the etch-retarding layer and at least a portion of the metal gate material underlying the thin region to provide the metal gate material with a desired surface profile.

In exemplary embodiments of the method, the etch-retarding layer is a polymer.

In exemplary embodiments of the method, the etch-retarding layer extends from a first edge of the metal gate material, over a central region of the metal gate material, to a second edge of the metal gate material, and the thick region of the etch-retarding layer lies over the central region.

In exemplary embodiments, the method includes forming a metal liner over the metal gate material, wherein the metal gate material and the metal liner form a metal gate; wherein the desired surface profile of the metal gate material comprises a sloped upper surface having a lowest point; wherein the metal liner contacts the sloped upper surface along a gate interface having a gate interface area; wherein a horizontal cross section of the metal gate material at the lowest point of the sloped upper surface has a cross-sectional area; and wherein the gate interface area is greater than the cross-sectional area. In such embodiments of the method, the gate interface area may be about 1.05 to about 1.4 times greater than the cross-sectional area.

In exemplary embodiments, the method includes forming a liner over the desired profile of the gate material, wherein the liner has a sloped top surface; and forming an interconnect in contact with the sloped top surface of the liner at a contact interface extending from an upper end to a lower end and defining a contact interface area; wherein a horizontal cross-section of the interconnect at the upper end of the contact interface has an interconnect cross-sectional area, and wherein the contact interface area is greater than the interconnect cross-sectional area. In such embodiments, the contact interface area is about 1.05 to about 1.4 times greater than the interconnect cross-sectional area.

A semiconductor structure is provided in certain embodiments. The semiconductor structure includes an active region and a conductive gate overlying the active region, wherein the conductive gate includes a plug having a sloped upper surface with a lowest point and a liner overlying the sloped upper surface, wherein the liner contacts the plug along a gate interface having a gate interface area, wherein a horizontal cross section of the plug at the lowest point of the sloped upper surface has a plug cross-sectional area, and wherein the gate interface area is greater than the plug cross-sectional area.

In certain embodiments of the semiconductor structure, the gate interface area is about 1.05 to about 1.4 times greater than the plug cross-sectional area.

In certain embodiments of the semiconductor structure, the conductive liner has a sloped top surface, and the semiconductor structure further includes: a conductive interconnect in direct contact with the sloped top surface at a contact interface extending from an upper end to a lower end and defining a contact interface area, wherein a horizontal cross-section of the conductive interconnect at the upper end of the contact interface has an interconnect cross-sectional area, and wherein the contact interface area is greater than the interconnect cross-sectional area. In such embodiments, the contact interface area is about 1.05 to about 1.4 times greater than the interconnect cross-sectional area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method comprising:
    performing a first etch process to differentially etch a gate material to a recessed surface, wherein the recessed surface includes a first horn at a first edge, a second horn at a second edge, and a valley located between the first horn and the second horn;
    depositing an etch-retarding layer over the recessed surface, wherein the etch-retarding layer has a central region over the valley and has edge regions over the horns, and wherein the central region of the etch-retarding layer is thicker than the edge regions of the etch-retarding layer; and
    performing a second etch process to recess the horns to establish the gate material with a desired profile.

2. The method of claim 1, further comprising:
    forming a liner over the desired profile of the gate material, wherein the gate material and the liner form a gate;
    forming a dielectric material over the gate; and
    forming an interconnect in contact with the gate.

3. The method of claim 1, further comprising:
    before performing the first etch process, depositing the gate material in a cavity over an active area; and
    planarizing the gate material to define a planar upper surface of the gate material.

4. The method of claim 1 wherein the etch-retarding layer is a polymer.

5. The method of claim 1, further comprising:
    determining a desired threshold voltage for the gate material, wherein the desired profile of the gate material is selected based on the desired threshold voltage.

6. The method of claim 1, further comprising:
    forming a liner over the desired profile of the gate material, wherein the gate material and the liner form a gate;
    wherein the desired profile of the gate material comprises a sloped upper surface having a lowest point;
    wherein the liner contacts the sloped upper surface along a gate interface having a gate interface area;
    wherein a horizontal cross section of the gate material at the lowest point of the sloped upper surface has a cross-sectional area; and
    wherein the gate interface area is greater than the cross-sectional area.

7. The method of claim 6, wherein the gate interface area is about 1.05 to about 1.4 times greater than the cross-sectional area.

8. The method of claim 1, further comprising:
    forming a liner over the desired profile of the gate material, wherein the liner has a sloped top surface; and
    forming an interconnect in contact with the sloped top surface of the liner at a contact interface extending from an upper end to a lower end and defining a contact interface area; wherein a horizontal cross-section of the interconnect at the upper end of the contact interface has an interconnect cross-sectional area, and wherein the contact interface area is greater than the interconnect cross-sectional area.

9. The method of claim 8, wherein the contact interface area is about 1.05 to about 1.4 times greater than the interconnect cross-sectional area.

10. The method of claim 1, wherein the etch-retarding layer is a polymer.

11. The method of claim 1, further comprising:
    before performing the first etch process, depositing the gate material in a cavity over an active area; and
    planarizing the gate material to define a planar upper surface of the gate material.

12. The method of claim 1, further comprising determining a desired threshold voltage for the gate material, wherein the desired profile of the gate material is selected based on the desired threshold voltage.

13. The method of claim 1, further comprising forming a liner over the desired profile of the gate material, wherein:
    the gate material and the liner form a gate;
    the desired profile of the gate material comprises a sloped upper surface having a lowest point;
    the liner contacts the sloped upper surface along a gate interface having a gate interface area;
    a horizontal cross section of the gate material at the lowest point of the sloped upper surface has a cross-sectional area; and
    the gate interface area is greater than the cross-sectional area.

14. The method of claim 13, wherein the gate interface area is about 1.05 to about 1.4 times greater than the cross-sectional area.

15. The method of claim 1, further comprising:
    forming a liner over the desired profile of the gate material, wherein the liner has a sloped top surface; and
    forming an interconnect in contact with the sloped top surface of the liner at a contact interface extending from an upper end to a lower end and defining a contact interface area; wherein a horizontal cross-section of the interconnect at the upper end of the contact interface has an interconnect cross-sectional area, and wherein the contact interface area is greater than the interconnect cross-sectional area.

16. The method of claim 15, wherein the contact interface area is about 1.05 to about 1.4 times greater than the interconnect cross-sectional area.

17. The method of claim 1, wherein the first etch process is performed with $BCl_3/Cl_2/O_2$ gas, at a pressure of from 1 to 200 mTorr, at a power of from 400 to 1200 W, and with a bias of from 0 to 100 W.

18. The method of claim 1, wherein the etch-retarding layer is formed with a process performed with $BCl_3/CH_4/HBr$ gas or $SiCl_4/O_2/HBr$ gas, at a pressure of from 10 to 200 mTorr, at a power of from 400 to 1200 W, and with a bias of from 0 to 20 W.

19. The method of claim 1, wherein: the second etch process is performed with $CF_4/O_2/N_2$, $NF_3/O_2/N_2$, or $BCl_3/Cl_2/O_2$ gas, at a pressure of from 1 to 200 mTorr, at a power of from 400 to 1200 W, and with a bias of from 0 to 20 W.

20. The method of claim 1, wherein the thickness of the central region of the etch-retarding layer is at least 1.1 times greater than the thickness of the edge regions as measured at an interface of a dielectric layer and the gate material.

* * * * *